United States Patent
Herbordt et al.

(10) Patent No.: US 12,270,833 B2
(45) Date of Patent: Apr. 8, 2025

(54) OSCILLOSCOPE POST PROCESSING SYSTEM, METHOD AND MEASUREMENT DEVICE

(71) Applicant: Rohde & Schwarz GmbH & Co. KG, Munich (DE)

(72) Inventors: Wolfgang Herbordt, Ottobrunn (DE); Friedrich Reich, Stadtbergen/Ortsteil (DE); Philip Diegmann, Munich (DE); Christian Heidler, Hohenschäftlarn (DE); Ferdinand Mayet, Munich (DE); Joel Woodward, Colorado Springs, CO (US)

(73) Assignee: RHODE & SCHWARZ GMBH & CO. KG, Munich (DE)

( * ) Notice: Subject to any disclaimer, the term of this patent is extended or adjusted under 35 U.S.C. 154(b) by 384 days.

(21) Appl. No.: 17/736,932

(22) Filed: May 4, 2022

(65) Prior Publication Data

US 2023/0358788 A1    Nov. 9, 2023

(51) Int. Cl.
*G01R 13/02*    (2006.01)
(52) U.S. Cl.
CPC ....... *G01R 13/029* (2013.01); *G01R 13/0272* (2013.01)
(58) Field of Classification Search
CPC .............. G01R 13/029; G01R 13/0272; G01R 13/0209; G01R 13/04
USPC .......................................................... 324/112
See application file for complete search history.

(56) References Cited

U.S. PATENT DOCUMENTS

| | | | | |
|---|---|---|---|---|
| 2006/0182231 A1* | 8/2006 | Tan | ..................... | H04B 17/0085 379/30 |
| 2007/0098045 A1* | 5/2007 | Cameron | ............. | H04B 1/7156 375/E1.033 |
| 2008/0043583 A1* | 2/2008 | Hamre | ............... | G01R 13/0254 369/44.28 |
| 2017/0248633 A1* | 8/2017 | Montijo | ............. | G01R 13/0272 |
| 2019/0195915 A1* | 6/2019 | Günther | ............... | G01R 13/029 |
| 2021/0263085 A1* | 8/2021 | Tan | ..................... | G01R 13/0218 |
| 2023/0055303 A1* | 2/2023 | O'Brien | ............. | G01R 13/0254 |

FOREIGN PATENT DOCUMENTS

| | | |
|---|---|---|
| EP | 2434300 A1 | 3/2012 |
| EP | 3502712 A1 | 6/2019 |
| EP | 3508862 A2 | 7/2019 |

* cited by examiner

*Primary Examiner* — Raul J Rios Russo
(74) *Attorney, Agent, or Firm* — Patterson + Sheridan, LLP

(57) ABSTRACT

The present disclosure provides an oscilloscope post processing system for an oscilloscope, the oscilloscope post processing system comprising an acquisition memory that stores samples that represent at least one signal acquired by the oscilloscope, and an interval selector that is coupled to the acquisition memory and reads at least some of the stored samples from the memory and outputs at least one first set of the stored samples and at least one second set of the stored samples. Further, the present disclosure provides a respective method, and a respective measurement device.

19 Claims, 9 Drawing Sheets

OSCILLOSCOPE POST PROCESSING SYSTEM, METHOD AND MEASUREMENT DEVICE

TECHNICAL FIELD

The disclosure relates to an oscilloscope post processing system and a respective method.

BACKGROUND

Although applicable to any measurement instrument, the present disclosure will mainly be described in conjunction with oscilloscopes.

Measurement devices are used in many applications today, like for example during the development of new electronic devices or for identifying errors or faults in existing devices.

Users may be interested in analyzing signals in the time-domain and the frequency-domain concurrently.

SUMMARY

The above stated problem is solved by the features of the independent claims. It is understood, that independent claims of a claim category may be formed in analogy to the dependent claims of another claim category.

Accordingly, it is provided:

An oscilloscope post processing system for an oscilloscope, the oscilloscope post processing system comprising an acquisition memory that stores samples that represent at least one signal acquired by the oscilloscope, and an interval selector that is coupled to the acquisition memory and reads at least one of the stored samples from the memory and outputs at least one first set of the stored samples and at least one second set of the stored samples.

Further, it is provided:

A method for processing at least one signal acquired by an oscilloscope, the method comprising, storing samples that represent the at least one signal, reading at least one of the stored samples from the memory, and outputting at least one first set of the stored samples and at least one second set of the stored samples based on the read at least one sample.

Further, it is provided:

A measurement device comprising an oscilloscope post processing system according to the present disclosure.

A possible use case of an oscilloscope is the simultaneous analysis of time-domain waveforms and frequency-domain waveforms that may be obtained by a spectrum analysis of the time-domain waveforms.

The present disclosure is based on the finding that oscilloscopes usually use the same signal, or the same samples that represent the signal, as a basis for displaying the signal in the time-domain and in the frequency-domain to a user. Especially, some oscilloscopes may independently use the signal prior to digitizing the signal i.e., the analog signal, to generate the digital representations in the time-domain and the frequency-domain. Consequently, memory is required for storing the time-domain signal and the frequency-domain signal after generating the digital representations in the time-domain and the frequency-domain.

Using the same samples as a basis for displaying the signal in the time-domain and in the frequency-domain may, however, cause some implications that may reduce the flexibility of the data analysis in the oscilloscope.

The user may want to control the parameters of the time-domain and the frequency-domain independently from each other. That means that changing the parameters of one domain should neither change nor restrict the parameter settings of the other domain. This is, however, the case if the same signal or the same set of samples is used as a basis of the signal processing in the time-domain and the frequency-domain.

A coupling between the parameters of the two domain results e.g., from the time interval required for calculating the spectrum in contrast to the time interval of the time-domain waveform the user wants to see on the display.

The calculation of a spectrum requires a record length which is determined by a required resolution bandwidth and a required frequency span. For the display of a time-domain waveform, a record length is chosen as a function of the signal bandwidth and the time interval the oscilloscope user is interested in.

The contradiction between these two requirements increases with increasing ratio of resolution bandwidth and frequency span so that the user is more and more limited when it comes to independently controlling the time interval which is displayed on the screen.

The present disclosure, therefore, provides the oscilloscope post processing system that may be implemented in any kind of measurement device, like for example an oscilloscope. It is understood, that if the oscilloscope post processing system is described in conjunction with an oscilloscope in this disclosure, the respective description is meant to also cover the embodiment of the oscilloscope post processing system in any other measurement device.

The oscilloscope post processing system allows independently selecting samples that represent at least part of a signal acquired by the oscilloscope for the time-domain signal processing and for the frequency-domain signal processing.

To this end, the oscilloscope post processing system comprises the acquisition memory that stores the samples that represent at least one signal acquired by the oscilloscope. It is understood, that a dedicated oscilloscope post processing system, and therefore also a dedicated acquisition memory, may be provided for every channel of a multi-channel oscilloscope. In other examples, an oscilloscope post processing system may be shared by multiple channels of an oscilloscope.

The acquisition memory may be provided as a kind of ring-buffer that permanently stores samples that are received by the acquisition memory from a data acquisition section of e.g., an oscilloscope. A respective trigger system may control the acquisition memory to stop storing and, therefore, overwriting samples in the ring-buffer, when a respectively configured event is detected by the trigger system in the acquired signal. It is understood, that the trigger system may provide the user with a plurality of options for defining a trigger condition. In embodiments, the trigger system may allow a user to define zones or zone triggers. The user may for example draw a rectangle or any other shape on a display of an oscilloscope. The respective area may represent a trigger zone and the trigger system may generate a trigger signal if a signal component is detected within the defined zone. Of course, multiple zones may be defined, and zones may be defined in the time-domain or the frequency-domain. If multiple zones are defined, the zones may be combined with any adequate logical function like for example, AND, NAND, OR, and XOR.

In examples, the acquisition memory may be operated as a segmented memory. In this mode of operation, only relevant sections of the acquired signals are stored as respective samples in the acquisition memory. For example, if a bus signal is analyzed, there may be phases of no activity on the bus. Such phases may for example be characterized by a constant signa level (ignoring any noise). If the acquisition memory is operated as segmented memory, the samples may be only stored in the acquisition memory for phases that comprise activity on the bus i.e., that comprise signal levels that represent data on the bus. Of course, sections of a predetermined length of the signal before and after the relevant phases may also be stored.

The oscilloscope post processing system further comprises the interval selector that is coupled to the acquisition memory. The interval selector reads samples to form at least one first set of samples and at least one second set of samples independently from each other. Each set comprises at least one sample. In normal operation, the sets may comprise a plurality of samples.

The at least one first set and the at least one second set may each comprise at least in part the same samples stored in the acquisition memory. However, the at least one first set and the at least one second set may also differ at least in some of the samples. It is understood, that one or more first sets and one or more second sets may be provided by the interval selector. Any element that is described in the following as operating on the first set or the second set may operate on a single first or second set or on multiple first or second sets in parallel. If the respective element operates only on a single first or second set, an instance of the respective element may be provided for every first or second set that is processed by the respective element.

The oscilloscope post processing system allows generating the first sets and the second sets independently of each other but from the same source sample group that represents the signal to be analyzed. The settings for the time-domain may, consequently, be chosen independently of the settings for the frequency-domain.

In the further signal processing of the oscilloscope, the first sets may be used to analyze the signal in the time-domain and to generate a display of the signal in the time-domain. The second sets may be used to analyze the signal in the frequency-domain and to generate a display of the signal in the frequency-domain.

Storing a common sample set in the acquisition memory and selecting the relevant samples independently for the first sets and the second sets allows for example, using off-screen data i.e., data that is not shown in the time-domain, to calculate a frequency spectrum for the acquired signal. With this feature, the usage of the display area of an oscilloscope screen is optimized for the information the user is really interested in.

Allowing independent generation of the first sets and the second sets i.e., of the time interval used for the spectrum analysis and the time domain analysis, allows for a more flexible configuration of the signal analysis, and a simpler and more intuitive usage of oscilloscopes.

Oscilloscopes that independently store digital signal representations in the time-domain and the frequency-domain in the acquisition memory, as indicated above, consume a huge amount of memory for storing the data. With the oscilloscope post processing system, in contrast, memory is used more efficiently, since only one representation, especially a time-domain representation, of the signal is stored in the acquisition memory. This also allows applying the functions of the oscilloscope post processing system while an oscilloscope is used in a stop mode or in a history mode i.e., on data that has previously been stored in the acquisition memory.

Oscilloscopes, as indicated above, that independently store digital signal representations in the time-domain and the frequency-domain in the acquisition memory usually perform decimation or down conversion of the acquired signal prior to storing the samples representing the signal in the acquisition memory. With the down conversion prior to the acquisition memory, the flexibility in adjusting the main parameters of the spectrum analysis e.g., a center frequency, a frequency span, and a resolution bandwidth, is reduced once the signals are recorded in the acquisition memory, since these settings affect the settings of the down conversion, which has already been performed. The main parameters of the spectrum analysis may, therefore, only be changed within very limited ranges.

The oscilloscope post processing system operates on samples that represent a signal to be measured i.e., on digital data. It is understood, that the oscilloscope post processing system, or at least some elements of the oscilloscope post processing system, like the interval selector, the first sample selector, the second sample selector, the single sample selector, the decimator, the transformer, the digital down converter, and the controller may at least in part be provided as a dedicated processing element like for example, a processing unit, a microcontroller, a field programmable gate array, FPGA, a complex programmable logic device, CPLD, or the like. The oscilloscope post processing system and its elements may at least in part also be provided as a computer program product comprising computer readable instructions that may be executed by a processing element. In a further embodiment, the oscilloscope post processing system may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry, clock generation circuitry, analog signal processing circuitry or the like.

The acquisition memory may comprise any type of memory unit or memory device, like for example a RAM, ROM, E(E)PROM, a hard disk, an SSD disk or the like. The acquisition memory may also be provided as part of a memory that is already present in the respective application i.e., in a respective oscilloscope. The acquisition memory may for example be provided as a variable or an array of variables that is stored in a memory of an oscilloscope.

Further embodiments of the present disclosure are subject of the further dependent claims and of the following description, referring to the drawings.

In an embodiment, the interval selector may comprise a first sample selector that reads the samples of the at least one first set and outputs the at least one first set, and a second sample selector that reads the samples of the at least one second set and that outputs the at least one second set.

The interval selector may comprise two independent sample selectors, the first sample selector and the second sample selector. The first sample selector selects the samples for the first sets. The second sample selector selects the samples of the second sets.

The first sets and the second sets may, therefore, be generated in parallel and the following signal processing may be performed concurrently for finally displaying the waveforms of the time-domain and the frequency-domain on a display of the oscilloscope.

In another embodiment, the interval selector may comprise a single sample selector that reads the samples of the at least one first set and that outputs the at least one first set during a first period of time, and that reads the samples of the at least one second set and that outputs the at least one second set during a second period of time.

Providing a single sample selector that operates in a kind of time-multiplexed mode of operation and successively outputs the first sets and the second sets, reduces the complexity of the oscilloscope post processing system, since less hardware and/or program instructions are required.

The interval selector, as indicated above, may for example be provided at least in part in an FPGA. With such an implementation of the interval selector, the single sample selector may be provided as two different configurations that may be loaded into the FPGA in an alternating manner. To this end, the two configurations may be stored in a memory and may be loaded into the FPGA successively to generate the first sets and the second sets.

It is understood, that in any embodiment, that generates the first sets and the second sets successively, the display of the waveforms in the time-domain and the frequency-domain may be synchronized by a display control system of the respective oscilloscope to display the waveforms of the time-domain and the frequency-domain concurrently.

In yet another embodiment, the interval selector may comprise a single sample selector that concurrently reads the samples of the at least one first set and the at least one second set and that outputs the at least one first set and the at least one second set.

The samples required for the first set and second set may at least in part be the same i.e., the first sets and the second sets may overlap in the acquisition memory. The single sample selector may, therefore, read a consecutive number of samples from the acquisition memory that make up the first sets and the second sets.

The single sample selector may then output the first sets and the second sets, while only reading samples from the acquisition memory once.

In a further embodiment, the interval selector may comprise at least one of at least two first sample selectors that each read the samples of one of the at least two first sets and that each output the respective first set, and at least two second sample selectors that each read the samples of one of the at least two second sets and that each output the respective second set.

With multiple first sample selectors and multiple second sample selectors, the interval selector may output any number of first sets and second sets as required in the respective application.

It is understood, that one first sample selector may be provided for every first set, and that one second sample selector may be provided for every second set.

In an embodiment, the interval selector may comprise a single sample selector that reads the samples of at least two first sets and one second set, and that outputs the at least two first sets and the second set, or the samples of one first set and at least two second sets and that outputs the first set and the at least two second set, or the samples of at least two first sets and at least two second sets and that outputs the at least two first sets and the at least two second sets.

The single sample selector may provide different combinations of first sets and second sets, as required by a user or as required in a specific application.

The single sample selector may for example provide one first set and a plurality of second sets, a plurality of first sets and one second set, or a plurality of first sets and a plurality of second sets.

The user may therefore flexibly configure different time-domain and frequency-domain waveforms to be shown on a display of the oscilloscope.

In another embodiment, the at least one first set and the at least one second set may be at least in part different or differ in at least one of the samples.

As indicated above, choosing the first sets and the second sets from samples that are stored in the acquisition memory allows creating the first sets and the second sets individually. Of course, such first sets and second sets may differ in the samples they contain. It is understood, that if multiple first sets are provided, these may also differ in the samples they comprise, and that if multiple second sets are provided, these may also differ in the samples they comprise.

In yet another embodiment, the oscilloscope post processing system may comprise a decimator coupled to the interval selector. The decimator may receive at least one of the first set and reduces the number of samples of the at least one received first set.

In digital signal processing, "decimation" may be understood as the process of reducing the sampling rate. A "decimator" is the element that performs the decimation. In an embodiment, a decimator may for example comprise an optional lowpass-filter and may then drop or remove samples of the, optionally lowpass-filtered, signal.

The decimator may be provided in embodiments, to reduce the number of samples that need to be processed in the following signal processing for the time-domain waveform to be shown on the display of the oscilloscope to a user.

It is understood, that if multiple first sets are to be decimated, a dedicated decimator may be provided for every first set, or that the decimator may process multiple first sets in parallel.

In a further embodiment, the oscilloscope post processing system may comprise a transformer that is coupled to the interval selector and that receives at least one of the at least one second set and that transforms the signal represented by the samples of at least one second set from time-domain into frequency-domain.

The transformer may perform a Fourier Transform, like a Fast Fourier Transform or a Digital Fourier Transform or a Segmented Fast Fourier Transform or an Overlapping Fast Fourier Transform, based on the samples of the received at least one second set.

It is understood, that if multiple second sets are to be transformed, a dedicated transformer may be provided for every second set, or that the transformer may process multiple second sets in parallel.

The transformer may, in addition, perform any of the following signal processing functions: Interpolation, zero stuffing, windowing, trace arithmetic functions, marker insertion, and spectrogram calculation.

In an embodiment, the oscilloscope post processing system may comprise a digital down converter coupled to the interval selector. The digital down converter may receive the at least one second set and down converts the at least one second set.

Digital down conversion may be implemented to reduce the number of samples that need to be processed in any following signal processing step.

Measurement devices, like an oscilloscope may have an analog-to-digital converter, ADC, with very high sample rates to digitize signals. However, in many cases, the signal of interest represents only a small proportion of the recorded bandwidth. To extract the band of interest at a high sample rate would require a large filter. The digital down converter may be used to move the frequency band of interest down the spectrum so the sample rate may be reduced. Consequently, further signal processing of the respective second sets may be performed with less effort.

It is understood, that if multiple second sets are to be down converted, a digital down converter may be provided for every second set, or that the digital down converter may process multiple second sets in parallel.

In another embodiment, the oscilloscope post processing system may comprise a transformer that is coupled to the digital down converter and that receives the down-converted second set and that transforms the signal represented by the samples of the down-converted second set from time-domain into frequency-domain.

As explained above, the digital down converter reduces the sample rate of the respective second set. Consequently, when combining the transformer with the digital down converter, the processing load on the transformer is reduced.

The further explanations provided above for the transformer also apply, if the transformer is combined with the digital down converter.

In yet another embodiment, the oscilloscope post processing system may comprise a controller that controls at least one of storing of samples by the acquisition memory, selection of the samples of the at least one first set and selection of the samples of the at least one second set.

The controller may comprise a user interface for a user to configure the parameters of the signal acquisition and the displaying of the at least one first set and the at least one second set. It is understood, that the controller and the user interface may be implemented as the controller and user interface of an oscilloscope that comprises the oscilloscope post processing system.

The controller may for example control the storing of samples in the acquisition memory by configuring a trigger system according to a user input. The controller may also control the interval selector by indicating for example, which time interval of the acquired signal should be shown in the time-domain, or which frequency range should be shown in the frequency domain.

In a further embodiment, the oscilloscope post processing system may comprise a communication interface that is coupled to the interval selector and outputs at least one of the at least one first set and the at least one second set.

In embodiments, the communication interface may also be coupled to at least one of the digital down converter, the decimator, and the transformer and output the signals provided by these elements, respectively.

The communication interface serves for providing data to other computer devices, like for example a cloud server or a processing server. Such a computer device may receive the acquired and pre-processed data and perform further signal processing on the data.

It is understood, that the communication interface may comprise any kind of wired and wireless communication interfaces, like for example a network communication interface, especially an Ethernet, wireless LAN or WIFI interface, a USB interface, a Bluetooth interface, an NFC interface, a visible or non-visible light-based interface, especially an infrared interface.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
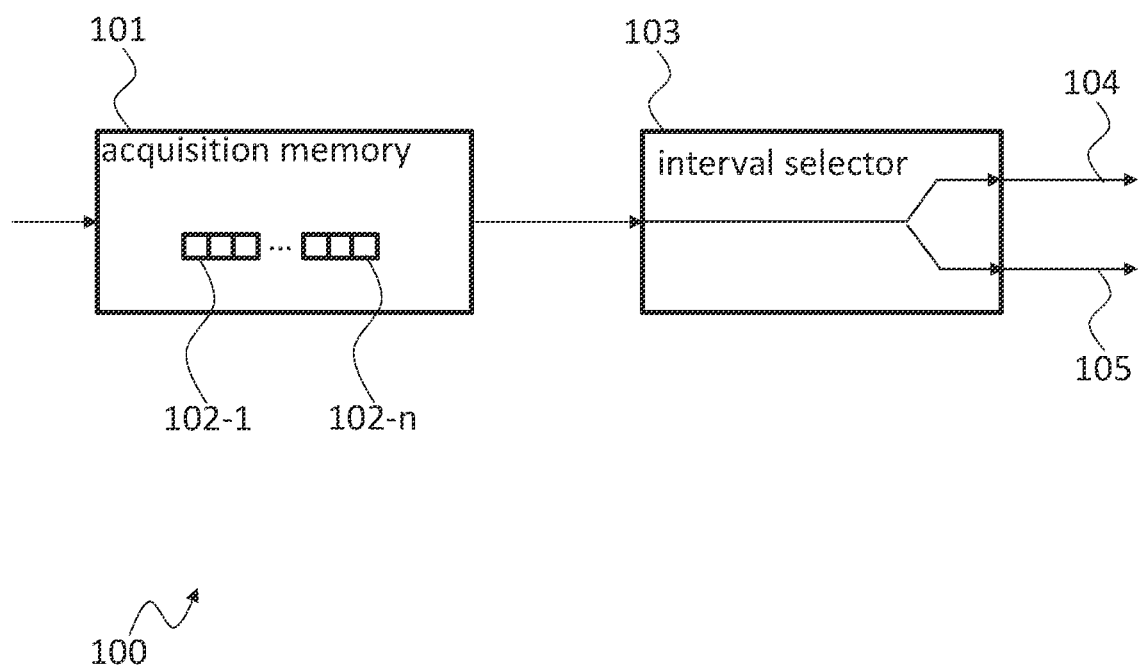
FIG. 1 shows a schematic diagram of an embodiment of an oscilloscope post processing system according to the present disclosure.

FIG. 1 shows an oscilloscope post processing system 100. The oscilloscope post processing system 100 comprises an acquisition memory 101 that stores samples 102-1-102-*n* that represent a signal that may be measured e.g., by an oscilloscope that comprises the oscilloscope post processing system 100. The acquisition memory 101 is coupled to an interval selector 103.

The interval selector 103 reads at least one of the stored samples 102-1-102-*n* from the memory and outputs at least one first set 104 of the stored samples 102-1-102-*n* and at least one second set 105 of the stored samples 102-1-102-*n*. As indicated above, the sets generated by the interval selector 103 may differ in at least one of the samples 102-1-102-*n*.

The first sets 104 provided by the interval selector 103 may serve for providing a time-domain waveform on a display of the oscilloscope. The second sets 105 in contrast, may serve for providing a frequency-domain waveform on the display of the oscilloscope.

Although not shown in FIG. 1, it is understood that the first sets 104 and second sets 105 may be further processed after being generated by the interval selector 103 and prior to displaying on a display of the oscilloscope to a user. Possible examples of such further signal processing are exemplarily shown in FIGS. 4 and 5.

It is understood, that the connection between the acquisition memory 101 and the interval selector 103 may be any kind of digital data connection like for example, a digital serial bus connection or a digital parallel data connection. The acquisition memory 101 and the interval selector 103 may comprise respective communication interfaces. In embodiments, the acquisition memory 101 and the interval selector 103 may be provided in the same hardware device or unit like for example, an ASIC, a CPLD or an FPGA. In such an embodiment, the data connection between the acquisition memory 101 and the interval selector 103 may be an internal data connection in such a device or unit.

It is further understood, that the interval selector 103 may output the first sets 104 and the second sets 105 as digital data or digital data stream via any adequate interface like for example, a digital serial data interface or a digital parallel data interface. In embodiments, the interval selector 103 and any following signal processing may be provided in a single hardware device or unit like for example, an ASIC, a CPLD or an FPGA. In such an embodiment, the data connection between the interval selector 103 and the following data processing circuitry or functions may be provided as an internal data connection in such a device or unit.

Figure 2:
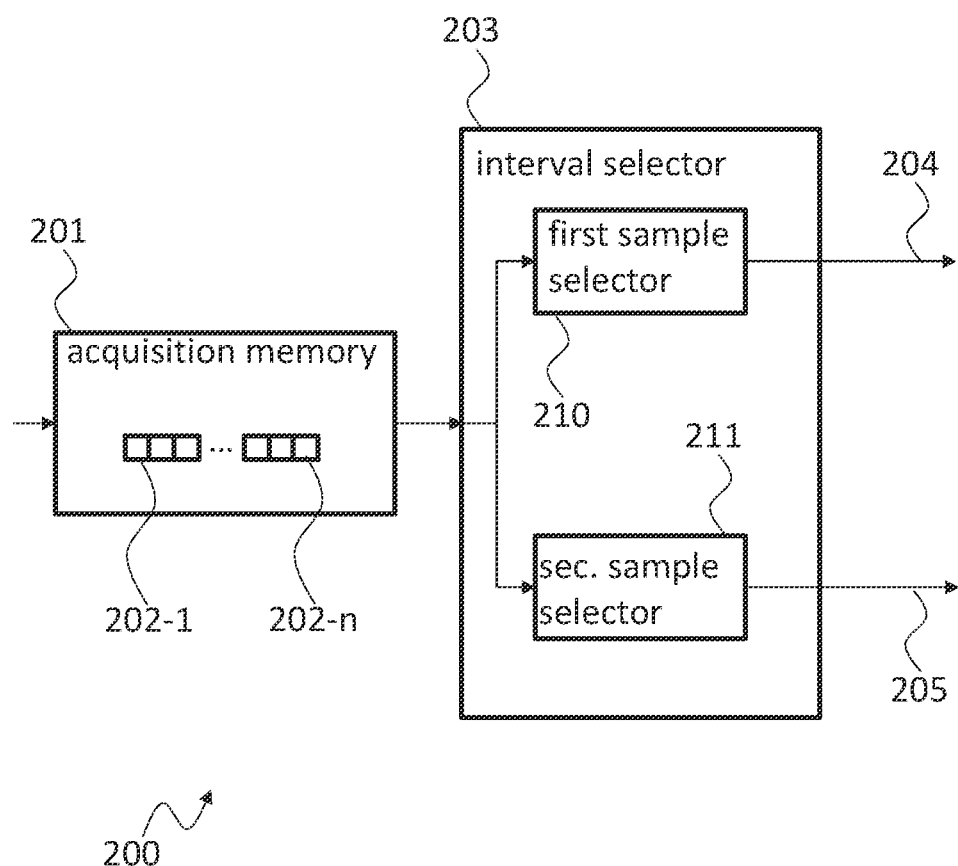
FIG. 2 shows a schematic diagram of another embodiment of an oscilloscope post processing system according to the present disclosure.

FIG. 2 shows an oscilloscope post processing system 200. The oscilloscope post processing system 200 is based on the oscilloscope post processing system 100. The oscilloscope post processing system 200, therefore, comprises an acquisition memory 201 that stores samples 202-1-202-n that represent a signal that may be measured e.g., by an oscilloscope that comprises the oscilloscope post processing system 200. The acquisition memory 201 is coupled to an interval selector 203. The explanations presented above regarding the oscilloscope post processing system 100 and its elements, therefore, apply to the oscilloscope post processing system 200 and its elements mutatis mutandis.

The interval selector 203 of the oscilloscope post processing system 200 comprises a first sample selector 210 and a second sample selector 211. The first sample selector 210 reads the samples 202-1-202-n for the first sets 204, and the second sample selector 211 reads the samples 202-1-202-n of the second sets 205.

The two separate sample selectors 210, 211 allow reading the samples 202-1-202-n in parallel, and independently generating the first sets 204 and second sets 205 in parallel.

In embodiments, the first sample selector 210 and the second sample selector 211 may at least in part be provided as configurations for an FPGA or CPLD. In such an embodiment, the single configurations may also be loaded in an alternating manner into the FPGA or CPLD. This reduces the amount of logic gates required in the FPGA or CPLD for performing the functions of both, the first sample selector 210 and the second sample selector 211. A respective controller for loading the configurations alternatingly into the FPGA or CPLD may be provided and coupled to the respective element.

Figure 3:
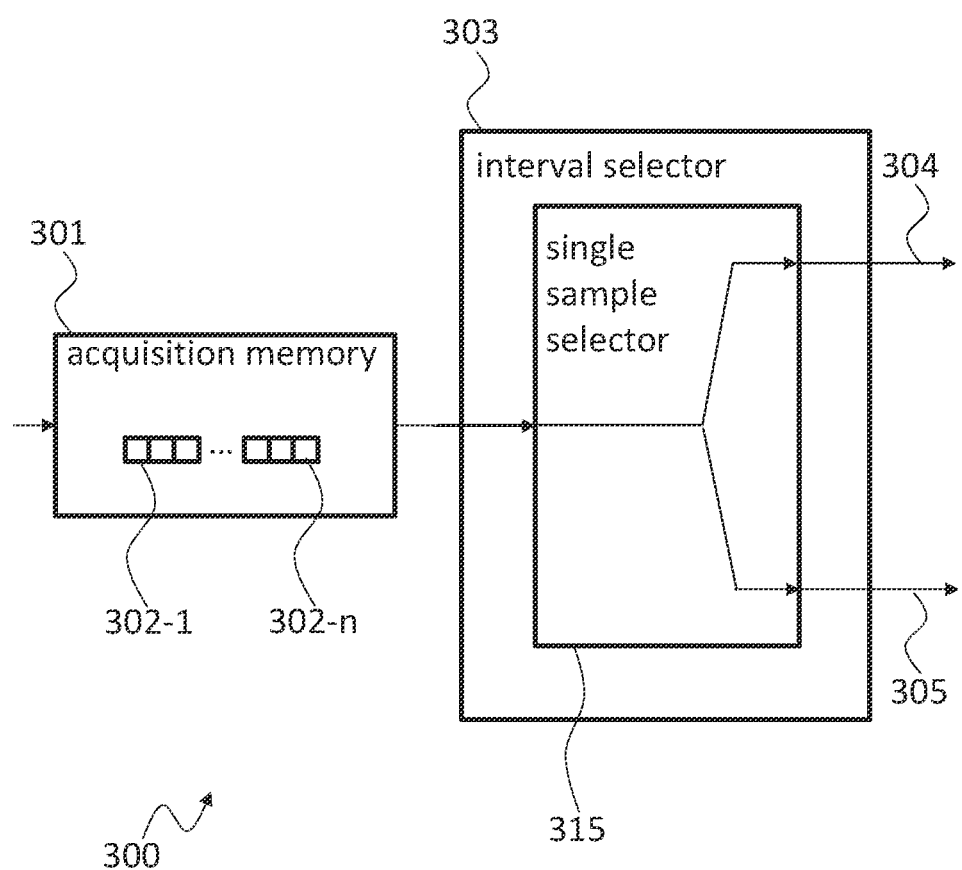
FIG. 3 shows a schematic diagram of another embodiment of an oscilloscope post processing system according to the present disclosure.

FIG. 3 shows an oscilloscope post processing system 300. The oscilloscope post processing system 300 is based on the oscilloscope post processing system 100. The oscilloscope post processing system 300, therefore, comprises an acquisition memory 301 that stores samples 302-1-302-n that represent a signal that may be measured e.g., by an oscilloscope that comprises the oscilloscope post processing system 300. The acquisition memory 301 is coupled to an interval selector 303. The explanations presented above regarding the oscilloscope post processing system 100 and its elements, therefore, apply to the oscilloscope post processing system 300 and its elements mutatis mutandis.

The interval selector 303 comprises a single sample selector 315 that is coupled to the acquisition memory 301 to read the samples 302-1-302-n that are required to form the first sets 304 and the second sets 305.

It is understood, that the single sample selector 315 may comprise the functionality to retrieve the samples 302-1-302-n for the first sets 304 and the samples 302-1-302-n for the second sets 305 successively. The single sample selector 315 may, therefore, output the first sets 304 at a first point in time or during a first time period, and may output the second sets 305 during a second point in time or during a second time period.

Figure 4:
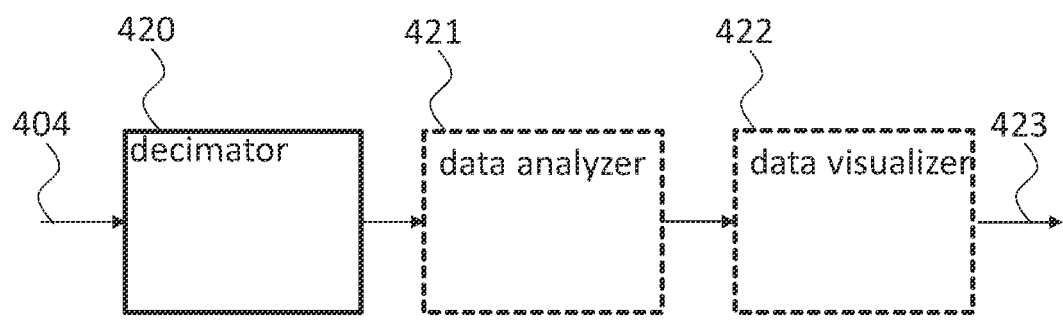
FIG. 4 shows a schematic diagram of an embodiment of a signal processing section of an oscilloscope post processing system according to the present disclosure.

FIG. 4 shows a signal processing section that may be provided in an embodiment of an oscilloscope post processing system according to the present disclosure. The signal processing section of FIG. 4 may be coupled to the interval selector and may receive the first sets 404.

The signal processing section comprises a decimator 420 that reduces the number of samples of the received first sets 404. The decimator 420 may for example comprise a logic that drops every n-th sample of the first sets 404, for example, every $2^{nd}$, $3^{rd}$, $4^{th}$ or $5^{th}$ sample or the like.

It is understood, that the decimator 420 may be configured or parametrized individually for each received first set 404 if multiple first sets 404 are provided to the decimator 420.

The signal processing section of FIG. 4 comprises further optional elements. In embodiments, the data analyzer 421 may be coupled to the decimator 420. The data analyzer 421 may perform further data analysis functions like for example, mathematical functions, arithmetic functions, and measurement functions.

As further optional element, a data visualizer 422 is provided, that may be coupled to the decimator 420 or, if present, to the data analyzer 421, or directly to the interval selector that provides the first sets 404.

The data visualizer 422 may process the data of the first sets 404 for visualization via for example, a display of an oscilloscope, and may provide respective processed data 423.

Figure 5:
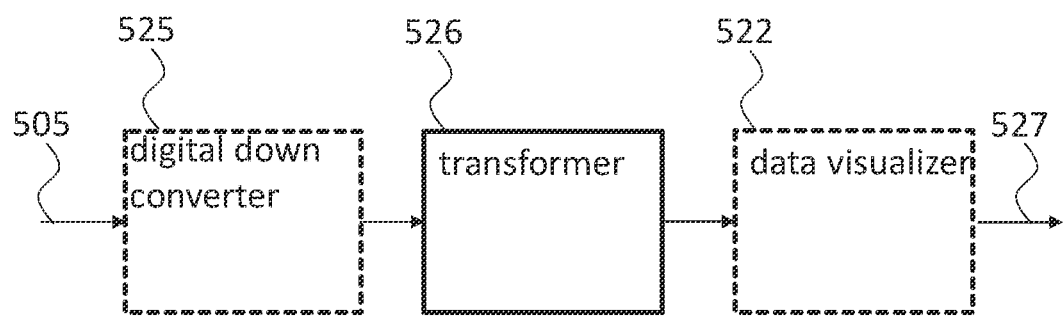
FIG. 5 shows a schematic diagram of an embodiment of another signal processing section of an oscilloscope post processing system according to the present disclosure.

FIG. 5 shows another signal processing section that may be used in an oscilloscope post processing system according to the present disclosure. The signal processing section of FIG. 5 may be coupled to the interval selector and may receive the second sets 505.

The signal processing section of FIG. 5 comprises an optional digital down converter 525 that may receive the second sets 505. If present, the digital down converter 525 is coupled to a transformer 526. Further, an optional data visualizer 522 may be provided, that may be coupled to the transformer 526. If no digital down converter 525 is present, the transformer 526 may directly receive the second sets 505.

The digital down converter 525 may reduce the bandwidth of a portion of the signal that is represented by the respective second sets 505 by moving the frequency range of interest to lower frequency regions that may be analyzed easily.

The transformer 526 transforms the signal represented by the respective second sets 505 into the frequency-domain.

It is understood, that the transformer 526 may be configured or parametrized individually for each received second set 505 if multiple second sets 505 are provided to the transformer 526.

The transformer 526 may further perform additional signal processing functions, like for example Interpolation, zero stuffing, windowing, trace arithmetic functions, marker insertion, and spectrogram calculation.

As further optional element, a data visualizer 522 is provided, that may be coupled to the transformer 526.

The data visualizer 522 may process the data of the first sets 504 for visualization via for example, a display of an oscilloscope, and may provide respective processed data 523.

Figure 6:
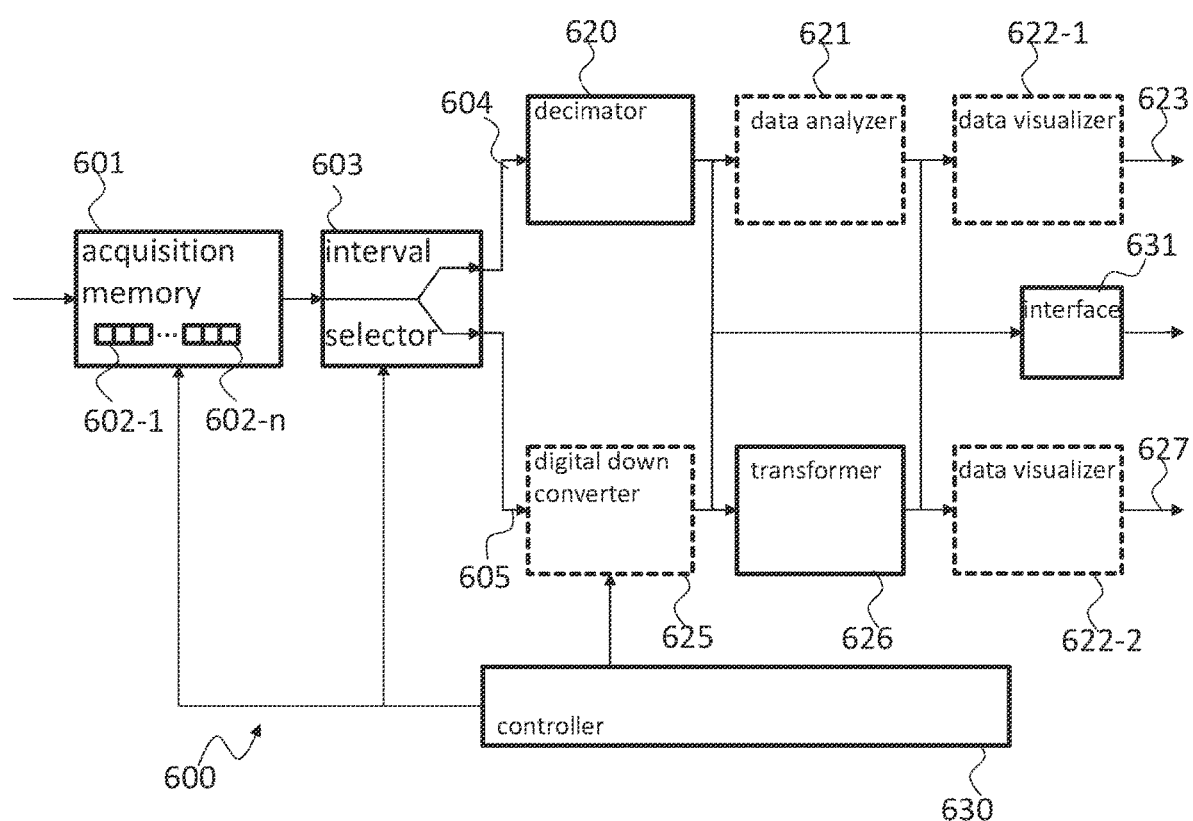
FIG. 6 shows a schematic diagram of another embodiment of an oscilloscope post processing system according to the present disclosure.

FIG. 6 shows an oscilloscope post processing system 600. The oscilloscope post processing system 600 is based on the oscilloscope post processing system 100 in combination with the signal processing sections of FIGS. 4 and 5. Therefore, the oscilloscope post processing system 600 comprises an acquisition memory 601 that stores samples 602-1-602-$n$ that represent a signal that may be measured e.g., by an oscilloscope that comprises the oscilloscope post processing system 600. The acquisition memory 601 is coupled to an interval selector 603. The explanations presented above regarding the oscilloscope post processing system 100 and its elements, therefore, apply to the oscilloscope post processing system 600 and its elements mutatis mutandis.

The interval selector 603 may be provided as any embodiment of the interval selector as described in this disclosure. The output of the interval selector 603 that provides the first sets 604 is coupled to a signal processing section as shown in FIG. 4 that comprises a decimator 620, an optional data analyzer 621, and an optional data visualizer 622-1. The output of the interval selector 603 that provides the second sets 605 is coupled to a signal processing section as shown in FIG. 5 that comprises an optional digital down converter 625, a transformer 626, and an optional data visualizer 622-2.

The oscilloscope post processing system 600 further comprises a controller 630 and a communication interface 631. The controller 630 may configure and control the acquisition memory 601, the interval selector 603, and the digital down converter 625, especially according to a user input. Although not shown, the controller 630 may also configure any other element of the oscilloscope post processing system 600, especially based on respective user input.

The communication interface 631 serves for providing any of the first sets 604 and the second sets 605 to other processing elements or computing elements, like for example a cloud server or a data processing server.

The communication interface 631 may be communicatively coupled to at least one of the interval selector 603, the decimator 620, the data analyzer 621, the digital down converter 625, and the transformer 626, as required.

Figure 7:
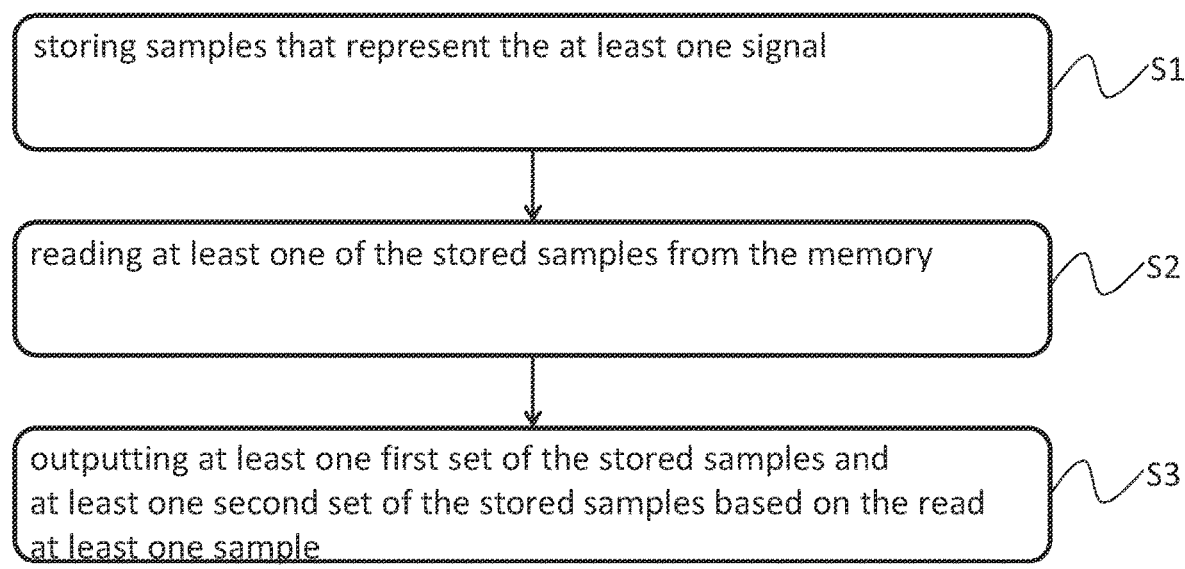
FIG. 7 shows a flow diagram of an embodiment of a method according to the present disclosure.

FIG. 7 shows a flow diagram of a method for processing at least one signal acquired by an oscilloscope. The method comprises storing S1 samples that represent the at least one signal, reading S2 at least one of the stored samples from the memory, and outputting S3 at least one first set of the stored samples and at least one second set of the stored samples based on the read at least one sample.

In an embodiment, the at least one first set and the at least one second set may be at least in part different.

In an embodiment, the samples of the at least one first set may be read and output by a first sample selector. The samples of the at least one second set may be read and output by a second sample selector. The samples of the at least one first set and the at least one second set may, therefore, be output concurrently. If one of the sets is a subset of the other set, the samples of the at least one first set and the at least one second set may be read concurrently and may then be output concurrently or subsequently.

In another embodiment, the samples of the at least one first set may be read and output during a first period of time. The samples of the at least one second set may be read and output during a second period of time.

The method may comprise reducing the number of samples of the at least one received first set, also called decimation.

The method may also comprise at least one of transforming the signal represented by the samples of at least one second set from time-domain into frequency-domain, or down-converting the at least one second set and transforming the signal represented by the samples of the at least one down-converted second set from time-domain into frequency-domain.

Figure 8:
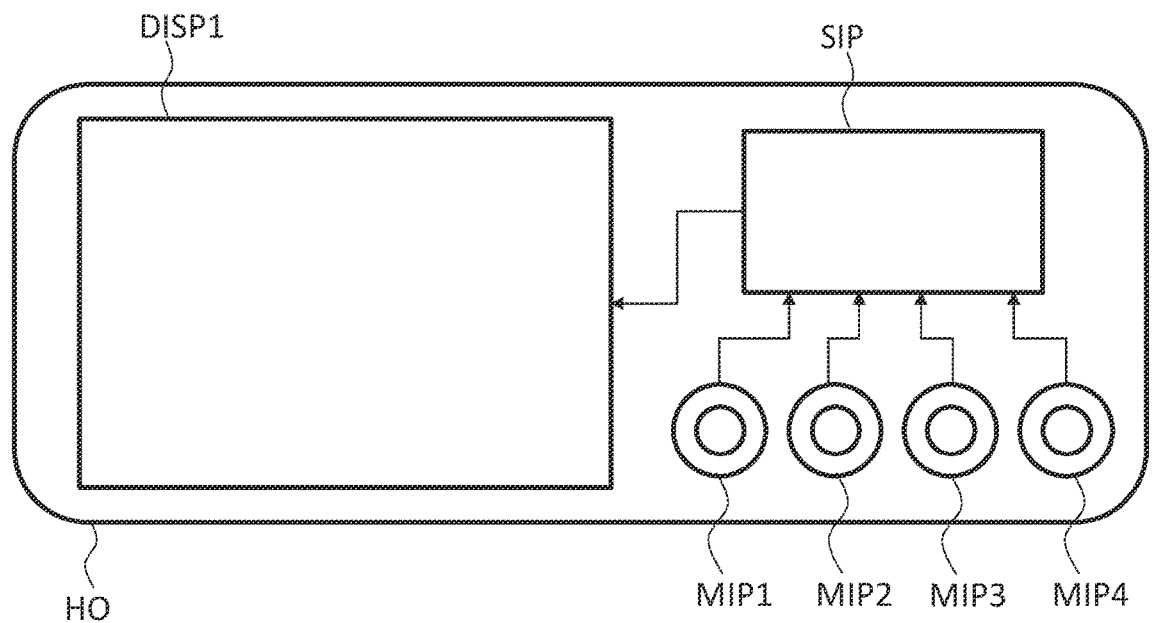
FIG. 8 shows a block diagram of an embodiment of an oscilloscope that may be used as a measurement device according to the present disclosure, and that may be used with an embodiment of an oscilloscope post processing system according to the present disclosure.

FIG. 8 shows a block diagram of an oscilloscope OSC1 that may be used with an embodiment of an oscilloscope post processing system according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs that may also be coupled to the differential measurement probe. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

The oscilloscope post processing system according to the present disclosure may at least in part be provided as additional function of the signal processor SIP, for example, as computer readable instructions that may be executed by the signal processor SIP.

Of course, the oscilloscope post processing system may also be provided at least in part as additional element in the oscilloscope OSC1 that may be coupled for example, to the signal processor SIP.

Figure 9:
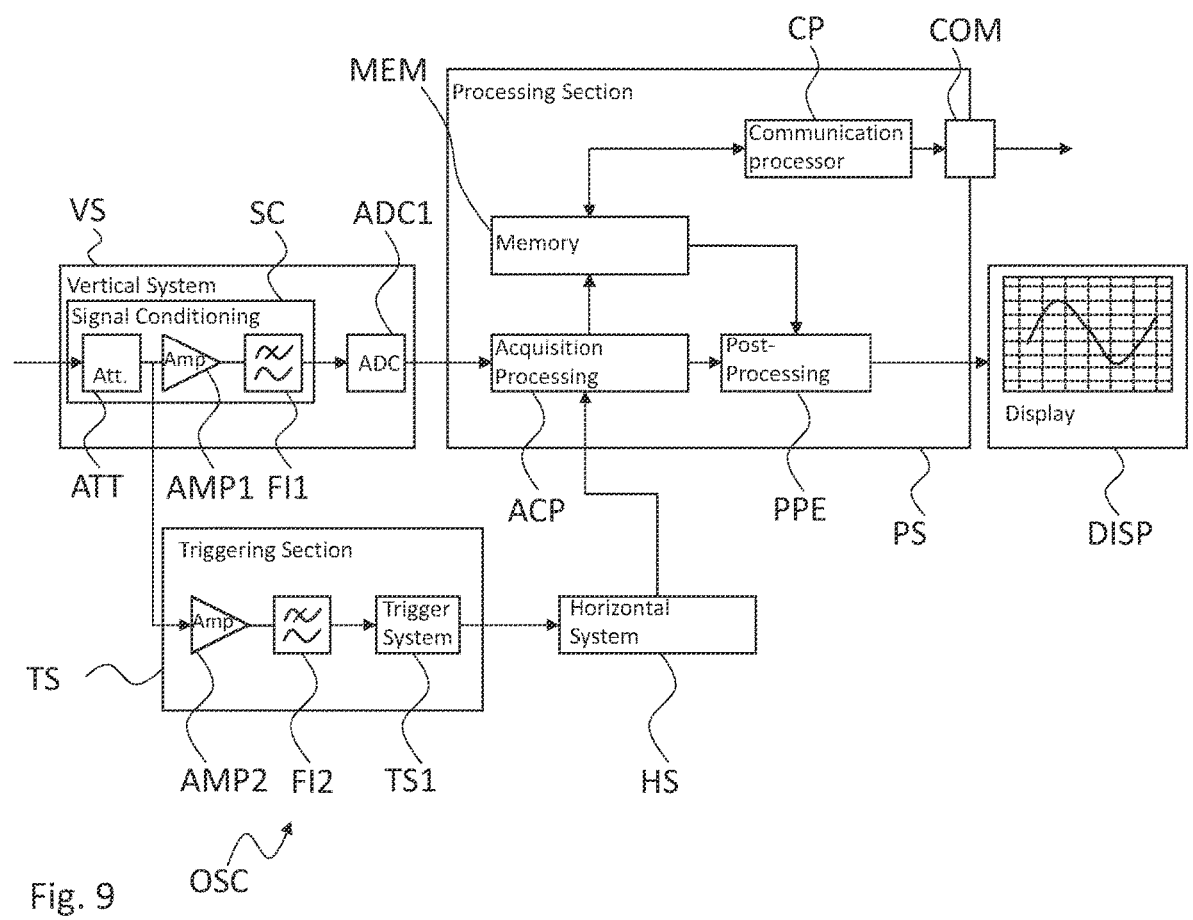
FIG. 9 shows a block diagram of another oscilloscope that that may be used as a measurement device according to the present disclosure, and that may be used with an embodiment of an oscilloscope post processing system according to the present disclosure.

FIG. 9 shows a block diagram of an oscilloscope OSC that may be used with an embodiment of an oscilloscope post processing system according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for attenuating or amplifying a signal to be acquired. The signal may for example be modified to fit the signal in the available space on the display DISP or to comprise a vertical size as configured by a user.

To this end, the vertical system VS comprises a signal conditioning section SC with an attenuator ATT that is coupled to an amplifier AMP1. The amplifier AMP1 is coupled to a filter F11, which in the shown example is provided as a low pass filter. The vertical system VS also comprises an analog-to-digital converter ADC1 that receives the output from the filter F11 and converts the received analog signal into a digital signal.

The attenuator ATT and the amplifier AMP1 serve to scale the waveform of the signal and to condition the amplitude of the signal to be acquired to match the operation range of the analog-to-digital converter ADC1. The filter F11 serves to filter out unwanted high frequency components of the signal to be acquired.

The triggering section TS comprises an amplifier AMP2 that is coupled to a filter F12, which in this embodiment is implemented as a low pass filter. The filter F12 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

The triggering section TS operates on the signal as provided by the attenuator ATT, which is fed into the amplifier AMP2. The amplifier AMP2 serves to condition the input signal to the operating range of the trigger system TS1. It is understood, that a common amplifier may also be used instead of the dedicated amplifiers AMP1 and AMP2.

In order to allow an exact matching of the trigger event and the waveform that is shown on the display DISP, a common time base may be provided for the analog-to-digital converter ADC1 and the trigger system TS1.

It is understood, that although not explicitly shown, the trigger system TS1 may comprise at least one of <configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the attenuator ATT but will operate on the digital signal as provided by the analog-to-digital converter ADC1.

A digital triggering section may comprise a processing element, like a processor, a DSP, a CPLD or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC1 and the output of the horizontal system HS as well as to a memory MEM and a post processing element PPE.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infra-red communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The acquisition processing element ACP manages the acquisition of digital data from the analog-to-digital converter ADC1 and the storage of the data in the memory MEM. The acquisition processing element ACP may for example comprise a processing element with a digital interface to the analog-to-digital converter ADC1 and a digital interface to the memory MEM. The processing element may for example comprise a microcontroller, a DSP, a CPLD or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user.

The display DISP controls all aspects of signal representation to a user, although not explicitly shown, may comprise any component that is required to receive data to be displayed and control a display device to display the data as required.

The oscilloscope post processing system according to the present disclosure may for example be provided as additional function of the acquisition processing element ACP for example, as computer readable instructions that may be executed by the acquisition processing element ACP.

Of course, the oscilloscope post processing system may also be provided at least in part as additional element in the oscilloscope OSC that may be coupled for example, to the acquisition processing element ACP.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

100, 200, 300, 600 oscilloscope post processing system
101, 201, 301, 601 acquisition memory
102-1-102-$n$, 202-1-202-$n$ samples
302-1-302-$n$, 602-1-602-$n$ samples
103, 203, 303, 603 interval selector
104, 204, 304, 404, 604 first set
105, 205, 305, 505, 605 second set
210 first sample selector
211 second sample selector
315 single sample selector
420, 620 decimator
421, 621 data analyzer
422, 522, 622-1, 622-2 data visualizer
423, 623 processed data
525, 625 digital down converter
526, 626 transformer
527, 627 processed data
630 controller
631 communication interface
OSC1 oscilloscope
HO housing
MIP1, MIP2, MIP3, MIP4 measurement input
SIP signal conditioning
DISP1 display
OSC oscilloscope
VS vertical system
SC signal conditioning
ATT attenuator
AMP1 amplifier
F11 filter
ADC1 analog-to-digital converter
TS triggering section
AMP2 amplifier
F12 filter
TS1 trigger system
HS horizontal system
PS processing section
ACP acquisition processing element
MEM memory
PPE post processing element
CP communication processor
COM communication interface
DISP display

The invention claimed is:

1. An oscilloscope post processing system for an oscilloscope, the oscilloscope post processing system comprising:
an acquisition memory that stores samples that represent at least one signal acquired by the oscilloscope;
an interval selector configured to execute on a processor, or comprising circuitry, that is coupled to the acquisition memory and reads at least one of the stored samples from the memory and outputs at least one first set of the stored samples and at least one second set of the stored samples; and
a transformer coupled to the interval selector and configured to receive the at least one second set and transform the signal represented by the samples of the second set, but not the first set, from time-domain into frequency-domain.

2. The oscilloscope post processing system according to claim 1, wherein the interval selector comprises a first sample selector configured to execute on a processor, or comprising circuitry that reads the samples of the at least one first set and outputs the at least one first set, and a second sample selector that reads the samples of the at least one second set and that outputs the at least one second set.

3. The oscilloscope post processing system according to claim 1, wherein the interval selector comprises a single sample selector configured to execute on a processor, or comprising circuitry that reads the samples of the at least one first set and that outputs the at least one first set during a first period of time, and that reads the samples of the at least one second set and that outputs the at least one second set during a second period of time.

4. The oscilloscope post processing system according to claim 1, wherein the interval selector comprises a single sample selector configured to execute on a processor, or comprising circuitry that concurrently reads the samples of the at least one first set and the at least one second set and that outputs the first set and the second set.

5. The oscilloscope post processing system according to claim 1, wherein the interval selector comprises at least two first sample selectors configured to execute on a processor, or comprising circuitry, the at least two first sample selectors are configured to each read the samples of one of the at least two first sets and that each output the respective first set, and at least two second sample selectors that each read the samples of one of the at least two second sets and that each output the respective second set.

6. The oscilloscope post processing system according to claim 1, wherein the interval selector comprises a single sample selector configured to execute on a processor, or comprising circuitry that reads:
the samples of at least two first sets and one second set, and that outputs the at least two first sets and the second set; or
the samples of one first set and at least two second sets and that outputs the first set and the at least two second set; or
the samples of at least two first sets and at least two second sets and that outputs the at least two first sets and the at least two second sets.

7. The oscilloscope post processing system according to claim 1, wherein the at least one first set and the at least one second set are at least in part different.

8. The oscilloscope post processing system according to claim 1, comprising a decimator coupled to the interval selector, wherein the decimator receives at least one of the first set and reduces the number of samples of the at least one received first set.

9. The oscilloscope post processing system according to claim 1, comprising a digital down converter coupled to the interval selector, wherein the digital down converter is configured to receive the at least one second set and down convert the at least one second set.

10. The oscilloscope post processing system according to claim 9, comprising a transformer that is coupled to the digital down converter and is configured to receive the down-converted second set and that transform the signal represented by the samples of the down-converted second set from time-domain into frequency-domain.

11. The oscilloscope post processing system according to claim 1, comprising a controller configured to control at least one of storing of samples by the acquisition memory, selection of the samples of the at least one first set, and selection of the samples of the at least one second set.

12. The oscilloscope post processing system according to claim 1, comprising a communication interface that is coupled to the interval selector and is configured to output at least one of the at least one first set and the at least one second set.

13. A measurement device comprising:
an oscilloscope post processing system according to claim 1.

14. A method for processing at least one signal acquired by an oscilloscope, the method comprising:
storing samples that represent the at least one signal;
reading at least one of the stored samples from the memory;
outputting at least one first set of the stored samples and at least one second set of the stored samples based on the reading of the at least one sample; and
transforming the signal represented by the samples of the second set, but not the first set, from time-domain into frequency-domain.

15. The method according to claim 14, wherein the samples of the at least one first set are read and output by a first sample selector, and wherein the samples of the at least one second set are read and output by a second sample selector.

16. The method according to claim 14, wherein the samples of the at least one first set are read and output during a first period of time, and wherein the samples of the at least one second set are read and output during a second period of time.

17. The method according to claim 14, wherein the samples of the at least one first set and the at least one second set are read concurrently and output concurrently.

18. The method according to claim 14, wherein the at least one first set and the at least one second set are at least in part different.

19. The method according to claim 14, comprising at least one of:
reducing the number of samples of the at least one received first set; and
down converting the at least one second set and transforming the signal represented by the samples of the at least one down-converted second set from time-domain into frequency-domain.

* * * * *